United States Patent
Kim et al.

(10) Patent No.: US 6,905,569 B2
(45) Date of Patent: Jun. 14, 2005

(54) METHOD OF EMBEDDING OPTICAL FIBER IN MULTILAYER PRINTED CIRCUIT BOARD

(75) Inventors: Young-Woo Kim, Chungnam (KR); Young-Sang Cho, Chungbuk (KR); Dek-Gin Yang, Chungbuk (KR); Kyu-Hyok Yim, Chungbuk (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 267 days.

(21) Appl. No.: 10/414,688

(22) Filed: Apr. 16, 2003

(65) Prior Publication Data

US 2004/0031555 A1 Feb. 19, 2004

(30) Foreign Application Priority Data

Aug. 16, 2002 (KR) .................................. 2002-0048603

(51) Int. Cl.$^7$ .......................... B32B 31/00; G02B 6/12
(52) U.S. Cl. .................. 156/293; 156/153; 156/272.2; 385/14
(58) Field of Search .......................... 156/153, 272.2, 156/275.5, 275.7, 293, 298; 385/14; 29/825, 829, 830, 831, 832; 174/250; 361/748, 761

(56) References Cited

U.S. PATENT DOCUMENTS

| | | | |
|---|---|---|---|
| 5,985,086 A | * 11/1999 | Peall | 156/292 |
| 6,005,991 A | * 12/1999 | Knasel | 385/14 |
| 6,099,684 A | * 8/2000 | Dannoux | 156/293 |
| 6,181,854 B1 | * 1/2001 | Kojima et al. | 385/49 |
| 6,233,376 B1 | * 5/2001 | Updegrove | 385/14 |
| 6,370,292 B1 | 4/2002 | Strake | |
| 6,788,859 B1 | * 9/2004 | Markovich et al. | 385/114 |
| 6,829,413 B2 | * 12/2004 | Brooks et al. | 385/31 |
| 2002/0131727 A1 | * 9/2002 | Reedy et al. | 385/88 |

* cited by examiner

*Primary Examiner*—John T. Haran
(74) *Attorney, Agent, or Firm*—Gottlieb, Rackman & Reisman, P.C

(57) ABSTRACT

There is disclosed a method of embedding an optical fiber in the miltilayer printed circuit board without causing chemical or thermal damage to the optical fiber, in which a groove is formed on a substrate consisting of a dielectric substrate layer having a conductive layer formed on one side thereof, for example by a router bit process, the optical fiber is embedded in the groove using an adhesive liquid to give a optical substrate, and then at least one printed circuit board is laminated on and under the single optical substrate or the layered structure of two or more of the optical substrate.

22 Claims, 5 Drawing Sheets

METHOD OF EMBEDDING OPTICAL FIBER IN MULTILAYER PRINTED CIRCUIT BOARD

BACKGROUND OF THE INVENTION

1. Field of the Invention

The present invention relates to a method of embedding at least one optical fiber in a multilayer printed circuit board without causing chemical or thermal damage to the optical fiber, whereby high frequency signals are capable of being transmitted without noise.

2. Description of the Prior Art

As well known to those skilled in the art, when electronic components are electrically connected with each other, or power voltage or ground voltage is supplied in large-scaled devices such as a computer, an electric signal is conventionally processed by a patterned conductive copper layer laminated on a printed circuit board where at least one electric circuit is formed on an inner and outer layer. Meanwhile, nowadays, there is a need for a broad bandwidth and a high-speed signal processing in order to cope with an increased data traffic and transmission according to a rapid increase of use of the Internet and improved service on the Internet. However, the electric signal is subject to a restriction attributable to electro magnetic susceptibility (EMS) during a high speed switching within a giga band, and thus a medium capable of replacing a method of patterning a copper plate is inevitably required.

To avoid the above-mentioned disadvantage, a method of applying an optical fiber to a printed circuit board is suggested, in which both an electric signal and an optical signal are propagated on a single substrate in such a way that an ultra high-speed data communication is interfaced with the, optical signal, a data storage and a signal processing in the components are conducted with the electric signal and a signal transmission is conducted by an optical signal.

As for a first and a second generation back plane, a signal processing is conducted with respect to the optical fiber in the so-called "point to point" manner. But, many studies have been performed on an optical signal interface using a multi-channel manner so as to simultaneously process a large amount of data since a third generation.

For example, U.S. Pat. No. 6,005,991 discloses a printed circuit board assembly comprising a printed circuit board having an interior portion and an edge portion surrounding the interior portion, and a flexible optical circuit disposed upon the interior portion of the printed circuit board. According to this patent, the flexible optical circuit comprises a pair of at least partially flexible sheets and a plurality of optical fibers extending between respective first and second ends, the plurality of optical fibers disposed between the at least partially flexible sheets. In addition, a multi-fiber connector is mounted on the respective first ends of the plurality of optical fibers. However, this patent is disadvantageous in that the flexible sheet is made of a specific film such as MYLAR® or KAPTON® film, not a common material for the printed circuit board, thus incurring a high cost for materials. Furthermore, this patent discloses a method of mounting the flexible sheet having the optical fiber embedded therein on the printed circuit board, but does not teach or suggest a method of embedding the optical fiber in an interior layer of the printed circuit board.

In addition, U.S. Pat. No. 6,370,292 proposes an optoelectronic, multilayer printed circuit board comprising at least one outer layer to be fitted with a plurality of components, an electrical printed circuit trace on the exterior of the outer layer, a layer system including a plurality of additional, optically transparent layers and arranged with respect to the at least one outer layer, and at least one optical signal-transmission paths patterned in an arbitrary layout and cross-section in the layer system as an integrated multimode strip waveguide. However, this patent does not teach or suggest any specific and efficient way for embedding the optical fiber in an inner layer of the printed circuit board without chemical or thermal damage to the optical fiber.

Therefore, there remains a need to develop a technology of embedding the optical fiber in a multilayer printed circuit board using a conventional substrate without causing chemical or thermal damage to the optical fiber.

The present inventors have conducted extensive studies to solve the above problems, resulting in the finding that an optical fiber can be embedded in a multilayer printed circuit board without causing chemical or thermal damage to the optical fiber by forming a groove for receiving the optical fiber in a dielectric substrate layer by a router bit process, followed by laminating at least one optical substrate having the optical fiber embedded in the groove using an adhesive liquid (such as an epoxy-based adhesive liquid) with at least one printed circuit board, thereby accomplishing the present invention.

SUMMARY OF THE INVENTION

Therefore, it is an object of the present invention to provide a method of embedding at least one optical fiber in a multilayer printed circuit board without causing chemical or thermal damage to the optical fiber.

It is another object of the present invention to provide a method of embedding at least one optical fiber in a multilayer printed circuit board, whereby high frequency signals can be transmitted without noise.

According to one aspect of the present invention, there is provided a method of embedding at least one optical fiber in a multilayer printed circuit board, comprising the following steps of:

a) providing a substrate consisting of a dielectric substrate layer having a conductive layer formed on one side thereof;

b) forming at least one groove for receiving the optical fiber on the dielectric substrate layer of the substrate;

c) coating an adhesive liquid at least on an inner surface of the groove;

d) inserting the optical fiber in the coated groove;

e) hardening the adhesive liquid coated on the inner surface of the groove, thereby securing the optical fiber into the groove to form an optical substrate; and f) laminating at least one printed circuit board on each side of the optical substrate.

According to another aspect of the present invention, there is provided a method of embedding at least one optical fiber in a multilayer printed circuit board, comprising the following steps of:

a) providing a substrate consisting of a dielectric substrate layer having a conductive layer formed on one side thereof;

b) forming at least one groove for receiving the optical fiber on the dielectric substrate layer of the substrate;

c) coating an adhesive liquid at least on an inner surface of the groove;

d) inserting the optical fiber in the coated groove;

e) hardening the adhesive liquid coated on the inner surface of the groove, thereby securing the optical fiber into the groove to form an optical substrate;

f) layering two or more of the optical substrate by use of a dielectric adhesive layer, said dielectric adhesive layer being interposed between said optical substrates to give a layered structure of the optical substrates; and g) laminating at least one printed circuit board on each side of the resulting layered structure.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
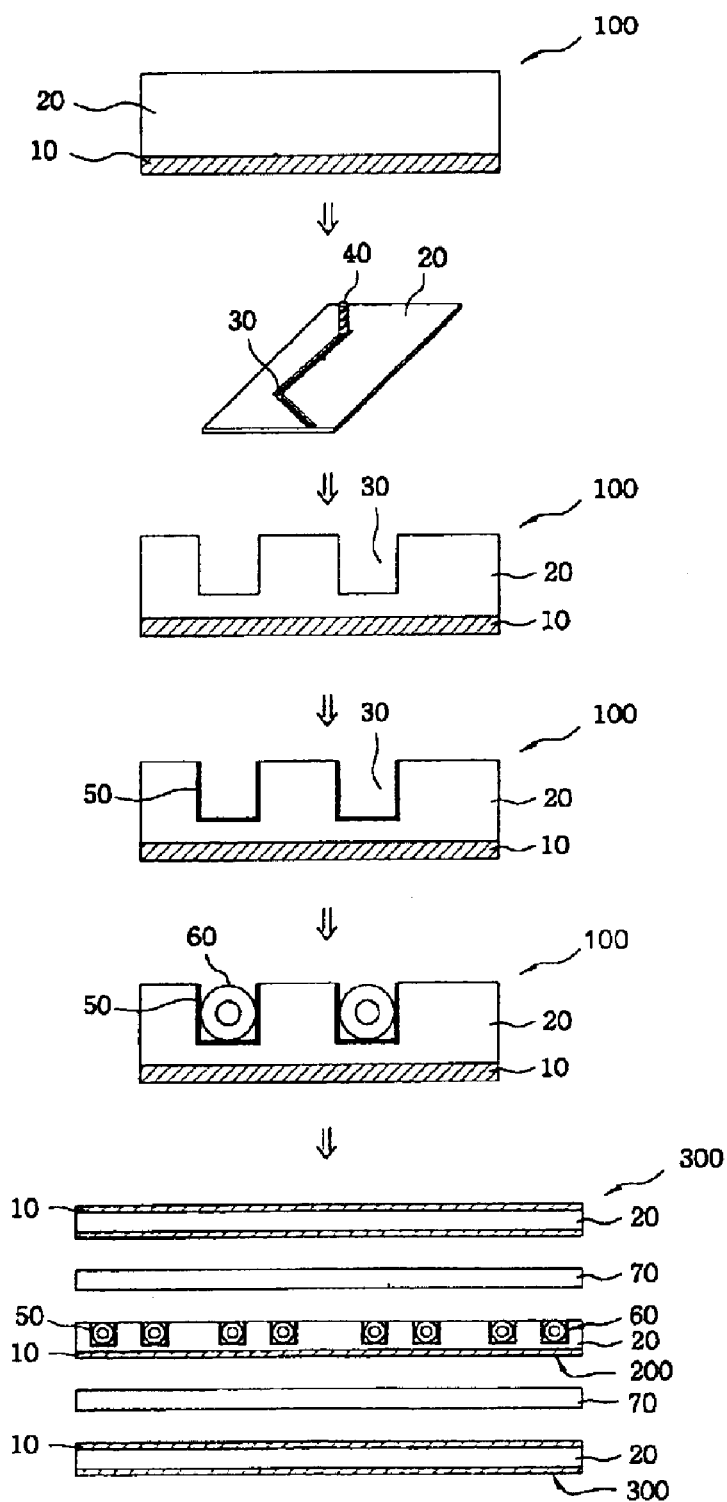
FIG. 1 illustrates an embedding scheme of at least one optical fiber in a multilayer printed circuit board according to a first embodiment of the present invention.

In the present invention, a substrate for an optical substrate consists of a dielectric substrate layer having a conductive layer (e.g. copper-plated layer), preferably of thin film, formed on one side thereof. Such a substrate for optical substrate is exemplified by a resin coated copper (RCC), one side of which is coated with resin. Further, the dielectric substrate layer is made of a resin impregnated fiber glass cloth such as an epoxy impregnated woven glass mat (glass-epoxy), polyimide, FR-4, resincyanate ester, teflon (PTFE), polyethylene ether, or a combination thereof.

According to the present invention, preferably, at least one groove for receiving the optical fiber is formed on the dielectric substrate layer by a router bit process. For instance, a CNC router having a router bit vertically mounted thereon may be employed.

Then, an adhesive liquid is coated onto the inner surface of the groove of the substrate. The adhesive liquid is thermal curable or UV curable, and an epoxy-based adhesive liquid may be employed with preference. According to the present invention, the following two coating manners are available:

In the case that the number of the optical fibers to be embedded in the printed circuit board is so small as to be capable of applying the adhesive liquid manually, the adhesive liquid may be selectively coated onto the inner surface of the groove. On the contrary, in the case that the number of the optical fibers to be embedded in the printed circuit board is too large to apply the adhesive liquid manually, the adhesive liquid is coated on the whole surface of the dielectric substrate layer including the groove.

Next, the optical fiber is inserted into the groove, and then secured onto the inner surface of the grooves by hardening the coated adhesive liquid. At this time, the adhesive liquid is hardened by heat or ultraviolet light. On the other hand, when coating the adhesive liquid on the whole dielectric substrate, an additional step of firmly contacting the optical fiber by use of squeegee, followed by scraping off the adhesive liquid coated on a portion other than the groove is required. In this manner, an optical substrate is fabricated.

The optical fiber useful in the present invention consists of a core and a cladding layer surrounding the core. For example, the core and cladding layer may be made of glass and have a diameter of about 125 μm with preference.

Thereafter, at least one printed circuit board is laminated on and under the fabricated optical substrate. Examples of the printed circuit board include a single side printed circuit board having a circuit layer formed on one side thereof, which is a type of copper clad laminate (CCL), and a double side printed circuit board having circuit layers formed on both sides thereof, which is a type of a resin coated copper (RCC).

In the case of using the double side printed circuit board, a dielectric adhesive layer is interposed between the optical substrate and the printed circuit board. The dielectric adhesive layer can be selected from the group consisting of prepreg, a film, and a resin. Of them, prepreg is preferred.

Alternatively, two or more optical substrates are layered with a dielectric adhesive layer interposed therebetween, then at least one printed circuit board is laminated on and under the resulting layered structure to embed the optical fiber in the multilayer printed circuit board. In this regard, the dielectric adhesive layer used in layering the optical substrates can be made of the same material as that used for lamination of the optical substrate and the printed circuit board.

According to the present invention, an optical fiber can be embedded in a multilayer printed circuit board without causing chemical or thermal damage to the optical fiber, and the multilayer printed circuit board, having at least one optical substrate with an optical fiber, can transmit high frequency signals without noise to be readily designed without limitation of electrical properties.

Reference should now be made to the drawings, in which the same reference numerals are used throughout the different drawings to designate the same or similar components.

FIG. 1 illustrates an embedding scheme of at least one optical fiber in a multilayer printed circuit board according to a first embodiment of the present invention.

With reference to FIG. 1, a substrate 100 in which a copper layer 10 is plated on one side of a dielectric substrate layer 20 is subjected to a router bit process to form a groove 30 on the dielectric substrate layer 20.

An epoxy adhesive liquid 50 is then coated on an inner surface of the groove 30, and an optical fiber 60 is inserted in the coated groove 30. As described earlier, the coated adhesive liquid 50 may be hardened by heat (for example, at about 100 to 120° C.) or by a UV source (for example, having a wavelength of about 250 nm), and thus an optical substrate 200 is formed.

Then, prepregs 70 are positioned on and under the optical substrate 200, and double side printed circuit boards 300 are laminated on and under the resulting structure to embed the optical fiber 60 in the multilayer printed circuit board.

Figure 2:
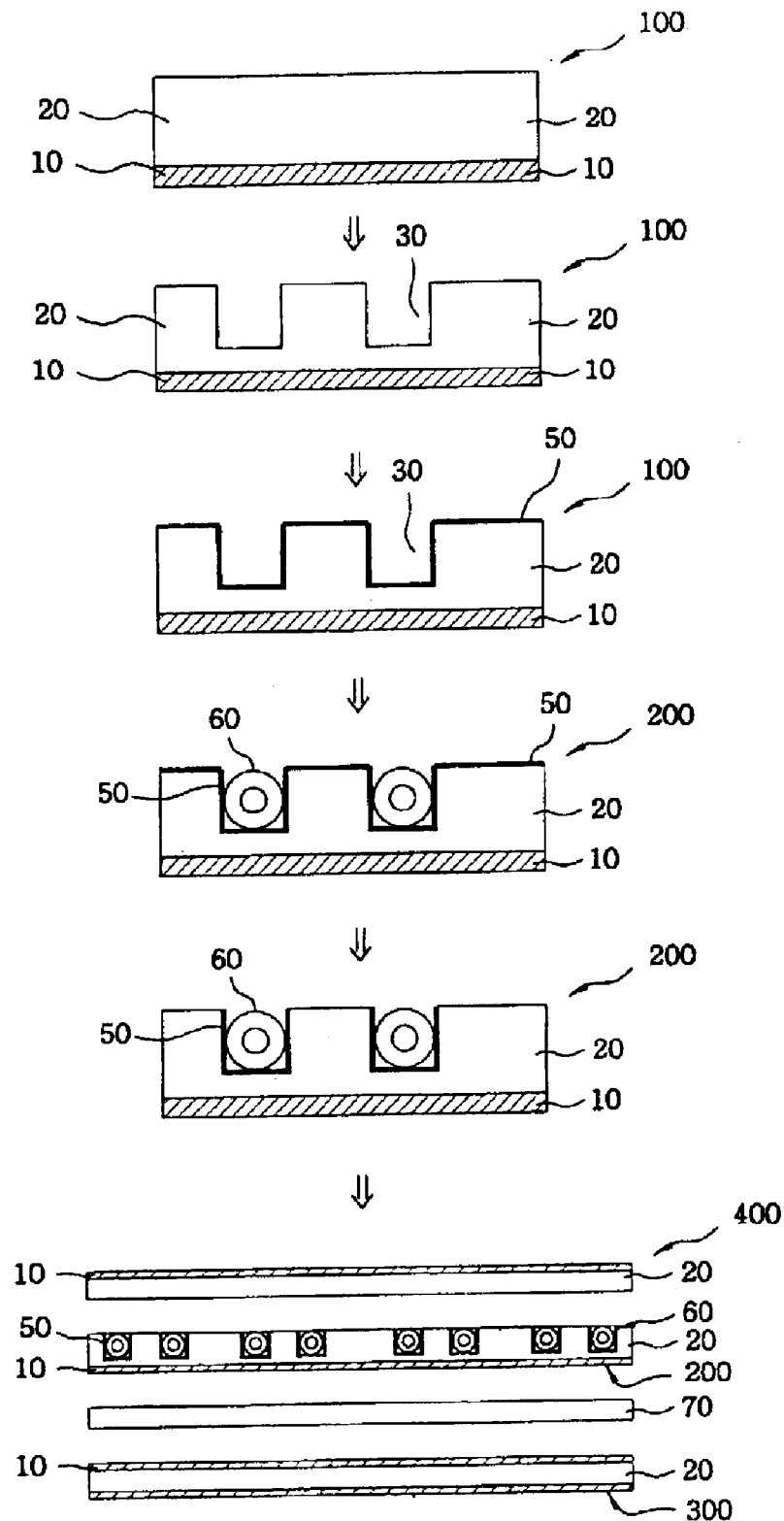
FIG. 2 illustrates an embedding scheme of at least one optical fiber in a multilayer printed circuit board according to a second embodiment of the present invention.

FIG. 2 illustrates an embedding scheme of at least one optical fiber in a multilayer printed circuit board according to a second embodiment of the present invention.

Referring to FIG. 2, a substrate 100 is subjected to a router bit process to form a groove 30 on the dielectric substrate layer 20 of the substrate 100, as shown in FIG. 1. An epoxy adhesive liquid 50 is then coated on the dielectric substrate layer 20 in which the groove 30 is formed, and an optical fiber 60 is inserted into the coated groove 30.

The optical fiber 60 is firmly contacted with the inner surface of the groove 30 using a squeegee (not shown in FIG. 2), and then the adhesive liquid coated on a portion other than the groove 30 is scraped off.

Thereafter, the adhesive liquid 50 is hardened by heat or UV light to form an optical substrate 200, as described above.

A single side printed circuit board 400 is layered on the optical substrate 200, and a double side printed circuit board 300 is layered in conjunction with the prepreg 70 under the optical substrate 200 to embed the optical fiber 60 in the multilayer printed circuit board.

Figure 3:
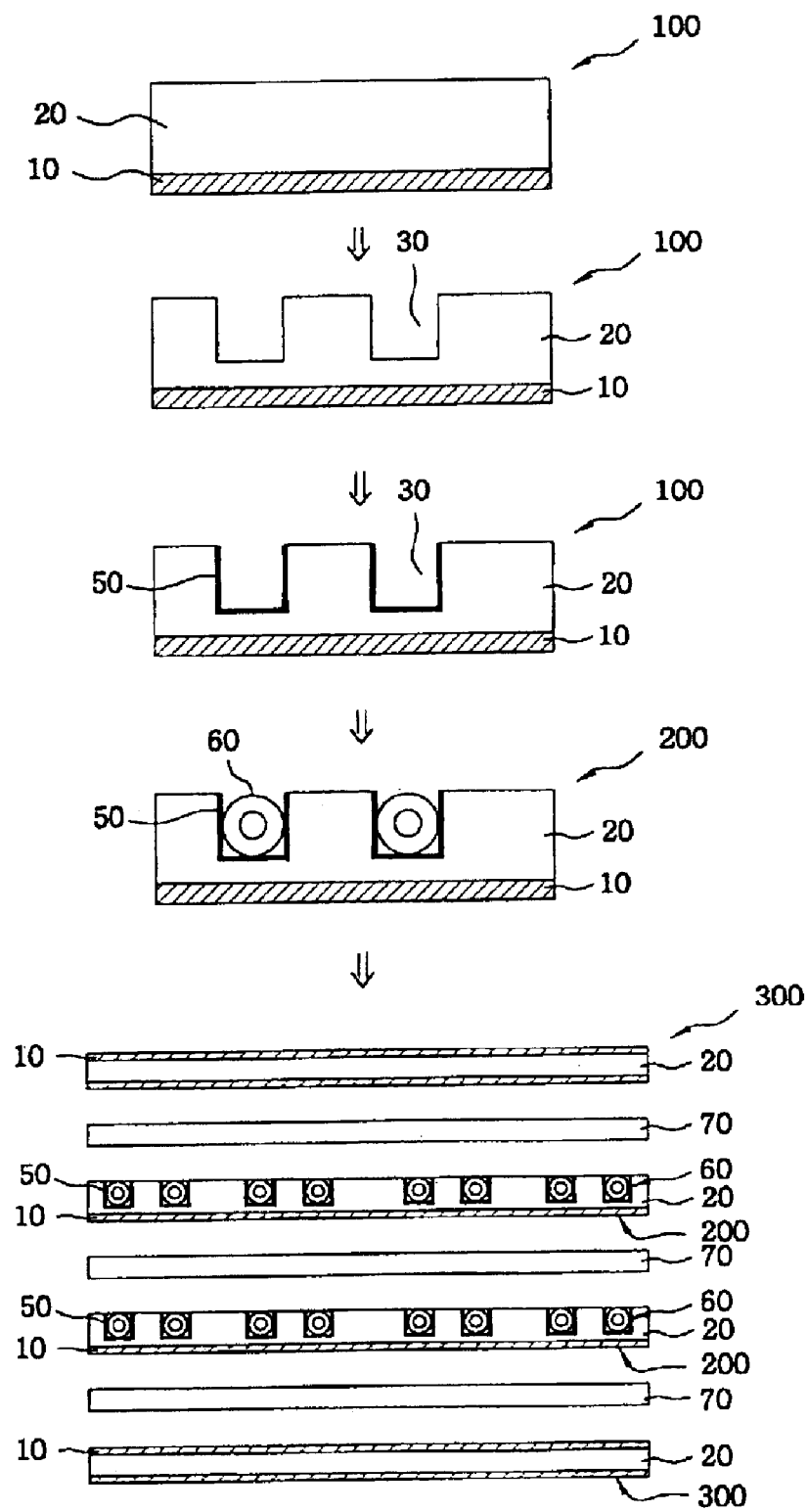
FIG. 3 illustrates an embedding scheme of at least one optical fiber in a multilayer printed circuit board according to a third embodiment of the present invention.

FIG. 3 illustrates an embedding scheme of at least one optical fiber in a multilayer printed circuit board according to a third embodiment of the present invention.

Turning to FIG. 3, an optical fiber 60 is embedded in a substrate 100 to form an optical substrate 200 in the same manner as shown in FIG. 1. A prepreg 70 is then positioned between two optical substrates 200, and other prepregs 70 are positioned in conjunction with double side printed circuit boards 300 on and under the resulting structure, thereby embedding the optical fiber 60 in the multilayer printed circuit board.

Figure 4:
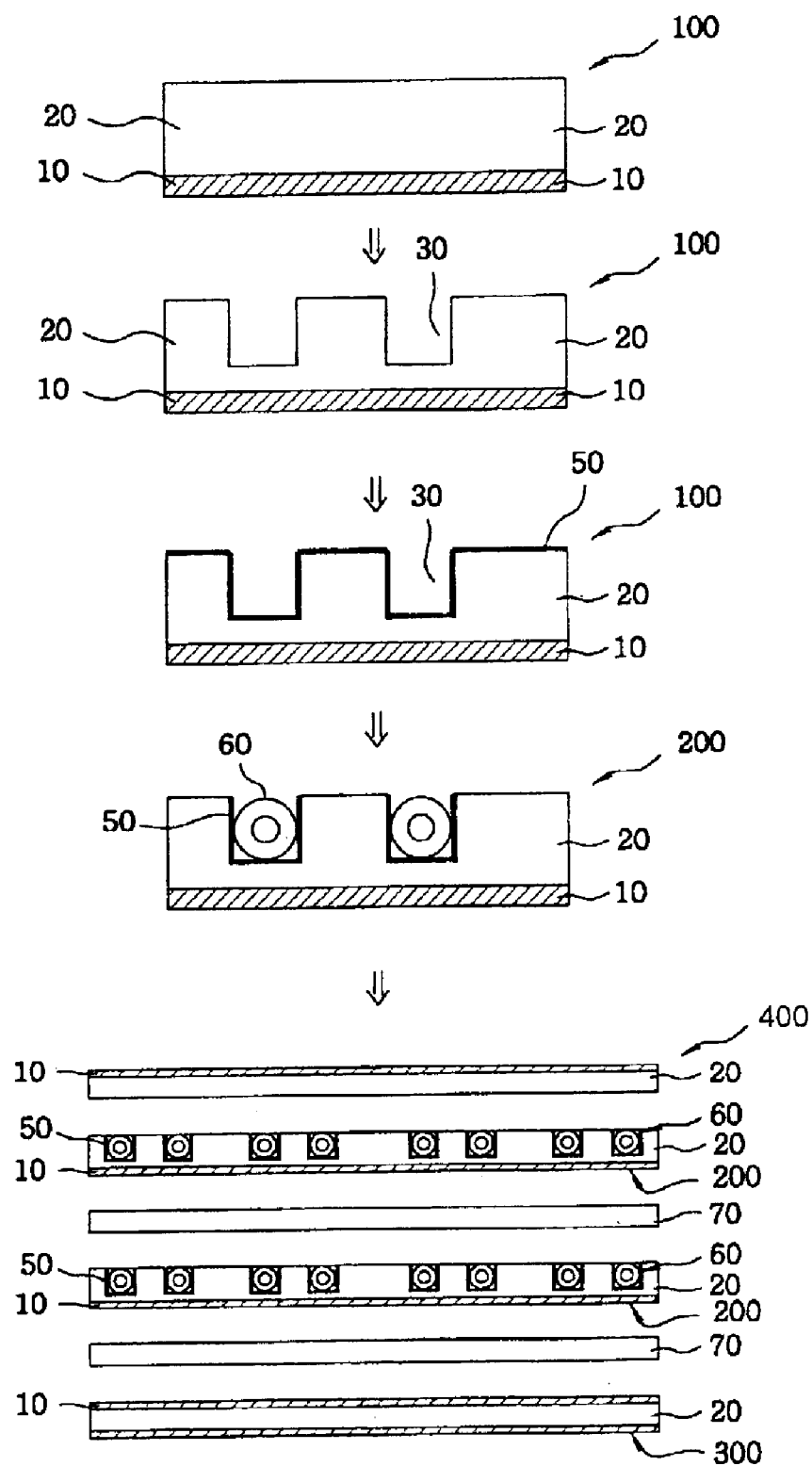
FIG. 4 illustrates an embedding procedure of at least one optical fiber in a multilayer printed circuit board according to a fourth embodiment of the present invention.

FIG. 4 illustrates an embedding scheme of at least one optical fiber in a multilayer printed circuit board according to a fourth embodiment of the present invention.

With reference to FIG. 4, an optical fiber 60 is embedded in a substrate 100 to form an optical substrate 200 in the same manner as shown in FIG. 2. A prepreg 70 is then inserted between two optical substrates 200, a single side printed circuit board 400 is positioned on the resulting layered structure, and a double side printed circuit board 300 is layered in conjunction with the prepreg 70 under the resulting layered structure, thereby embedding the optical fiber 60 in the multilayer printed circuit board.

Figure 5:
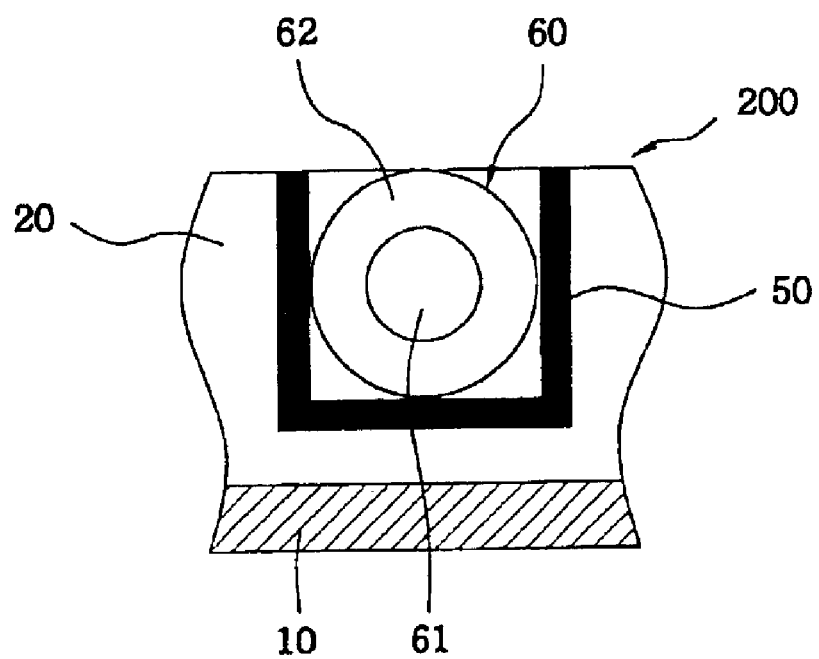
FIG. 5 is an enlarged sectional view of the optical fiber embedded in the multilayer printed circuit board according to the present invention.

FIG. 5 is an enlarged sectional view of the optical substrate 200 in which the optical fiber 60 is embedded according to the present invention. As illustrated in FIG. 5, the optical fiber 60 consists of a core 61 and a cladding layer 62 surrounding the core 61.

The inventive multilayer printed circuit board comprising at least one optical substrate having the optical fiber embedded therein can transceive a light signal without any electromagnetic interference (EMI) using the optical fiber embedded in the multilayer printed circuit board, thus being applied as a back plane and a daughter board to devices such as switches of networks and transmitter/receivers, switches and servers of datacom, communication devices of aerospace and avionics fields, UMTS mobile phone (universal mobile telephone system) based on a station, high-end enterprise computer servers, mainframe/super computers, and high-end computer auxiliary devices.

Therefore, the present method is advantageous in that optical fibers may be embedded in the multilayer printed circuit board without causing chemical or thermal damage thereto, and high frequency signals may be transmitted without noise by such a multilayer printed circuit board.

It should also be understood that the foregoing relates to only the scope of the invention is defined by the appended claims rather than by the description preceding them, and all changes that fall within meets and bounds of the claims, or equivalence of such meets and bounds are therefore intended to be embraced by the claims.

What is claimed is:

1. A method of embedding at least one optical fiber in a multilayer printed circuit board, comprising the following steps of:

a) providing a substrate consisting of a dielectric substrate layer having a conductive layer formed on one side thereof;

b) forming at least one groove for receiving the optical fiber on the dielectric substrate layer of the substrate;

c) coating an adhesive liquid at least on an inner surface of the groove;

d) inserting the optical fiber in the coated groove;

e) hardening the adhesive liquid coated on the inner surface of the groove, thereby securing the optical fiber into the groove to form an optical substrate; and f) laminating at least one printed circuit board on each side of the optical substrate.

2. The method as defined in claim 1, wherein said at least one printed circuit board is a single side printed circuit board having a circuit layer formed on one side thereof, or a double side printed circuit board having circuit layers formed on both sides thereof.

3. The method as defined in claim 2, wherein the step f) is conducted with a dielectric adhesive layer being interposed between the printed circuit board and optical substrate, with proviso that the double side printed circuit board is laminated on the side of the optical substrate.

4. The method as defined in claim 1, wherein the adhesive liquid is hardened by heat or ultraviolet light.

5. The method as defined in claim 1, wherein the adhesive liquid is an epoxy-based adhesive liquid.

6. The method as defined in claim 1, wherein the optical fiber consists of a core and a cladding layer surrounding the core, the core and the cladding layer being made of glass.

7. The method as defined in claim 1, wherein the dielectric substrate layer is made of material selected from the group consisting of resin impregnated fiber glass cloth, polyimide, FR-4, resincyanate ester, teflon (PTFE), polyethylene ether, and a combination thereof.

8. The method as defined in claim 3, wherein the dielectric adhesive layer is a prepreg.

9. The method as defined in claim 1, wherein the adhesive liquid is selectively coated on an inner surface of the groove during the step c).

10. The method as defined in claim 1, further comprising, between the steps d) and e), the following steps of:

i) firmly contacting the inserted optical fiber with the inner surface of the groove using a squeegee, and ii) scraping off the adhesive liquid coated on a portion other than the groove, with proviso that the adhesive liquid is coated on the dielectric substrate layer in which the groove is formed during the step c).

11. The method as defined in claim 1, wherein the step b) is carried out by a router bit process.

12. A method of embedding at least one optical fiber in a multilayer printed circuit board, comprising the following steps of:

a) providing a substrate consisting of a dielectric substrate layer having a conductive layer formed on one side thereof;

b) forming at least one groove for receiving the optical fiber on the dielectric substrate layer of the substrate;

c) coating an adhesive liquid at least on an inner surface of the groove;

d) inserting the optical fiber in the coated groove;

e) hardening the adhesive liquid coated on the inner surface of the groove, thereby securing the optical fiber into the groove to form an optical substrate;

f) layering two or more of the optical substrate by use of a dielectric adhesive layer, said dielectric adhesive layer being interposed between said optical substrates to give a layered structure of the optical substrates; and g) laminating at least one printed circuit board on each side of the resulting layered structure.

13. The method as defined in claim 12, wherein the dielectric adhesive layer is a prepreg.

14. The method as defined in claim 12, wherein said at least one printed circuit board is a single side printed circuit board having a circuit layer formed on one side thereof, or a double side printed circuit board having circuit layers formed on both sides thereof.

15. The method as defined in claim 14, wherein the step g) is conducted with a dielectric adhesive layer being interposed between the printed circuit board and optical substrate, with proviso that the double side printed circuit board is laminated on the side of the optical substrate.

16. The method as defined in claim 12, wherein the adhesive liquid is hardened by heat or ultraviolet light.

17. The method as defined in claim 12, wherein the adhesive liquid is an epoxy-based adhesive liquid.

18. The method as defined in claim 12, wherein the step b) is carried out by a router bit process.

19. The method as defined in claim 12, wherein the adhesive liquid is selectively coated on an inner surface of the groove during the step c).

20. The method as defined in claim 12, further comprising, between the steps d) and e), the following steps of:

i) firmly contacting the inserted optical fiber with the inner surface of the groove using a squeegee, and ii) scraping off the adhesive liquid coated on a portion other than the groove, with proviso that the adhesive liquid is coated on the dielectric substrate layer in which the groove is formed during the step c).

21. The method as defined in claim 12, wherein the optical fiber consists of a core and a cladding layer surrounding the core, the core and the cladding layer being made of glass.

22. The method as defined in claim 12, wherein the dielectric substrate layer is made of material selected from the group consisting of resin impregnated fiber glass cloth, polyimide, FR-4, resincyanate ester, teflon (PTFE), polyethylene ether, and a combination thereof.

* * * * *